(12) United States Patent
Mui et al.

(10) Patent No.: US 8,830,745 B2
(45) Date of Patent: Sep. 9, 2014

(54) MEMORY SYSTEM WITH UNVERIFIED PROGRAM STEP

(71) Applicant: SanDisk Technologies Inc., Plano, TX (US)

(72) Inventors: Man Lung Mui, Fremont, CA (US); Changyuan Chen, San Ramon, CA (US); Seungpil Lee, San Ramon, CA (US); Yee Lih Koh, Milpitas, CA (US); Jongmin Park, Cupertino, CA (US); Hao Thai Nguyen, San Jose, CA (US); Vamsi Krishna Sakhamuri, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 14 days.

(21) Appl. No.: 13/751,692

(22) Filed: Jan. 28, 2013

(65) Prior Publication Data
US 2014/0022841 A1  Jan. 23, 2014

Related U.S. Application Data

(60) Provisional application No. 61/672,654, filed on Jul. 17, 2012.

(51) Int. Cl.
| | |
|---|---|
| G11C 16/04 | (2006.01) |
| G11C 16/34 | (2006.01) |
| G11C 16/10 | (2006.01) |
| G11C 11/56 | (2006.01) |
| G11C 16/12 | (2006.01) |

(52) U.S. Cl.
CPC ............ *G11C 16/3459* (2013.01); *G11C 16/10* (2013.01); *G11C 16/0408* (2013.01); *G11C 11/5628* (2013.01); *G11C 16/3436* (2013.01); *G11C 16/12* (2013.01)
USPC ............ 365/185.03; 365/185.22; 365/185.33; 365/185.14; 365/185.19; 365/185.17

(58) Field of Classification Search
CPC ........... G11C 11/5628; G11C 16/3459; G11C 16/10; G11C 2211/5621; G11C 16/3454; G11C 16/3436
USPC ............. 365/185.22, 185.03, 185.05, 185.17, 365/185.19, 189.05
See application file for complete search history.

(56) References Cited

U.S. PATENT DOCUMENTS

| | | | |
|---|---|---|---|
| 5,070,032 | A | 12/1991 | Yuan et al. |
| 5,095,344 | A | 3/1992 | Harari |
| 5,313,421 | A | 5/1994 | Guterman et al. |
| 5,315,541 | A | 5/1994 | Harari et al. |

(Continued)

OTHER PUBLICATIONS

Notification of Transmittal of the International Search Report and the Written Opinion of the International Searching Authority, or the Declaration for Int'l Application No. PCT/US2013/049047 mailed Oct. 10, 2013, 11 pages.

*Primary Examiner* — Thong Q Le
(74) *Attorney, Agent, or Firm* — Davis Wright Tremaine LLP

(57) ABSTRACT

In a programming operation that includes repeated bitscan, program, and verify steps, the bitscan steps may be hidden by performing bitscan in parallel with program preparation and program steps. The effect of a program step may be predicted from previous observation so that when a bitscan indicates that the memory cells are close to being programmed, a last programming step may be completed without subsequent verification or bitscan steps.

20 Claims, 7 Drawing Sheets

(56) References Cited

U.S. PATENT DOCUMENTS

| | | |
|---|---|---|
| 5,343,063 A | 8/1994 | Yuan et al. |
| 5,570,315 A | 10/1996 | Tanaka et al. |
| 5,661,053 A | 8/1997 | Yuan |
| 5,903,495 A | 5/1999 | Takeuchi et al. |
| 6,046,935 A | 4/2000 | Takeuchi et al. |
| 6,222,762 B1 | 4/2001 | Guterman et al. |
| 6,888,758 B1 | 5/2005 | Hemink et al. |
| 2005/0190603 A1 | 9/2005 | Lee et al. |
| 2007/0109857 A1 | 5/2007 | Kojima |
| 2009/0141560 A1 | 6/2009 | Park et al. |
| 2010/0061148 A1 | 3/2010 | Komatsu |
| 2011/0161571 A1 | 6/2011 | Kim et al. |
| 2012/0257456 A1* | 10/2012 | Komatsu .................. 365/185.22 |
| 2012/0321032 A1 | 12/2012 | Liu et al. |

\* cited by examiner

MEMORY SYSTEM WITH UNVERIFIED PROGRAM STEP

This application claims the benefit of Provisional Patent Application No. 61/672,654, filed on Jul. 17, 2012.

BACKGROUND

This application relates to the operation of re-programmable nonvolatile memory systems such as semiconductor flash memory systems, and, more specifically, to programming data in cells of such memory systems.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications. Conventional mass storage, based on rotating magnetic media such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card are ideally suited in the mobile and handheld environment because of its small size, low power consumption, high speed and high reliability features.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. In particular, flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

It is common in current commercial products for each storage element of a flash EEPROM array to store a single bit of data by operating in a binary mode, where two ranges of threshold levels of the storage element transistors are defined as storage levels. The threshold levels of transistors correspond to ranges of charge levels stored on their storage elements. In addition to shrinking the size of the memory arrays, the trend is to further increase the density of data storage of such memory arrays by storing more than one bit of data in each storage element transistor. This is accomplished by defining more than two threshold levels as storage states for each storage element transistor, four such states (2 bits of data per storage element) now being included in commercial products. More storage states, such as 16 states per storage element, are also being implemented. Each storage element memory transistor has a certain total range (window) of threshold voltages in which it may practically be operated, and that range is divided into the number of states defined for it plus margins between the states to allow for them to be clearly differentiated from one another. Obviously, the more bits a memory cell is configured to store, the smaller is the margin of error it has to operate in.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate. While the term "program" has been used historically to describe writing to a memory by injecting electrons to an initially erased charge storage unit of the memory cell so as to alter the memory state, it has now been used interchangeable with more common terms such as "write" or "record."

There are many commercially successful non-volatile solid-state memory devices being used today. These memory devices may be flash EEPROM or may employ other types of nonvolatile memory cells. Examples of flash memory and systems and methods of manufacturing them are given in U.S. Pat. Nos. 5,070,032, 5,095,344, 5,315,541, 5,343,063, and 5,661,053, 5,313,421 and 6,222,762. In particular, flash memory devices with NAND string structures are described in U.S. Pat. Nos. 5,570,315, 5,903,495, 6,046,935.

Performance is important for commercial non-volatile memory systems. For example, write speed is very important for many applications. In general it is desirable to write data as fast as possible so that large amounts of data may be written in a short time.

SUMMARY

In a programming operation that includes repeated bitscan, program, and verify steps, the bitscan steps may be hidden by performing bitscan in parallel with program preparation and programming steps. This means that programming proceeds before the results of the bitscan of the previously programmed data are known. The effect of a program step may be predicted from previous observation so that when a bitscan indicates that the memory cells are close to being programmed, a last programming step may be completed without subsequent verification or bitscan steps.

An example of a method of programming data in a plurality of nonvolatile memory cells includes: (a) applying a programming pulse to the plurality of nonvolatile memory cells; (b) verifying individually whether the memory cells have reached their respective target levels; (c) performing a bitscan operation to identify the number of memory cells that have reached their respective target levels; (d) comparing the number of memory cells that have reached their respective target levels with a threshold number; (e) repeating steps (a)-(d)

until it is determined that the number of memory cells that have reached their respective target levels exceeds the threshold number; and (f) subsequent to determining that the number of memory cells that have reached their respective target levels exceeds the threshold number, applying additional programming voltages to the plurality of nonvolatile memory cells.

Applying additional programming voltages may include applying at least a portion of a final programming pulse. The final programming pulse may be initiated prior to determining that the number of memory cells that have reached their respective target levels exceeds the threshold number. The final programming pulse may increase the number of memory cells that have reached their respective target levels by a predictable number, the predictable number obtained from prior observation of memory cells subject to programming. The threshold number may correspond to an error rate that exceeds Error Correction Code (ECC) correction capacity, and the application of the additional programming pulse may increase the number of memory cells that have reached their respective target levels to a number corresponding to an error rate that is within ECC correction capacity. Steps (c) and (d) of a first cycle may be performed in parallel with step (a) of a second cycle. The additional programming voltages may be applied without subsequently verifying whether the memory cells have reached their respective target levels, and without subsequently performing a bitscan operation to determine the number of memory cells that have reached their respective target levels.

An example of a method of programming data in a plurality of nonvolatile memory cells in multiple programming cycles includes: performing a plurality of programming cycles, each of the plurality of cycles including: (a) applying a programming pulse to the plurality of nonvolatile memory cells; (b) subsequently verifying individually whether the memory cells have reached their respective target levels; (c) subsequently performing a bitscan operation to identify the number of memory cells that have reached their respective target levels, the bitscan operation performed at least partially in parallel with step (a) of a subsequent programming cycle; and (d) subsequently comparing the number of memory cells that have reached their respective target levels with a threshold number.

In response to determining that the number of memory cells that have reached their respective target levels exceeds the threshold number, the subsequent programming cycle may be terminated after step (a) without performing steps (b)-(d). The threshold number may correspond to uncorrectable data and the terminated programming cycle may bring the number of memory cells that have reached their respective target levels to a final number that corresponds to correctable data. The effect of the terminated programming cycle may be known from observed cycle-to-cycle changes in numbers of memory cells reaching their respective target levels.

An example of a flash memory system may include: an array of flash memory cells; read/write circuits that program cells of the array of flash memory cells by performing a plurality of programming cycles, each of the plurality of programming cycles including: (a) applying a programming pulse to the plurality of nonvolatile memory cells; (b) subsequently verifying individually whether the memory cells have reached their respective target levels; (c) subsequently performing a bitscan operation to identify the number of memory cells that have reached their respective target levels, the bitscan operation performed at least partially in parallel with step (a) of a subsequent programming cycle; and (d) subsequently comparing the number of memory cells that have reached their respective target levels with a threshold number.

The read/write circuits may terminate the subsequent programming cycle after step (a) without performing steps (b)-(d) in response to determining that the number of memory cells that have reached their respective target levels exceeds the threshold number. The flash memory system may include Error Correction Coding (ECC) circuits. The threshold number may correspond to data that is uncorrectable by the ECC circuits, and the terminated programming cycle may bring the number of memory cells that have reached their respective target levels to a number that corresponds to data that is correctable by the ECC circuits. The array of flash memory cells may be arranged with cells connected in NAND strings to form a NAND flash memory array. The array of flash memory cells may comprise Single Level Cell (SLC) cells that are limited to two programmed states. The array of flash memory cells may comprise Multi Level Cell (MLC) cells that have more than two programmed states.

Additional objects, features and advantages of the present invention will be understood from the following description of its preferred embodiments, which description should be taken in conjunction with the accompanying drawings.

DETAILED DESCRIPTION

Memory System

Figure 1:
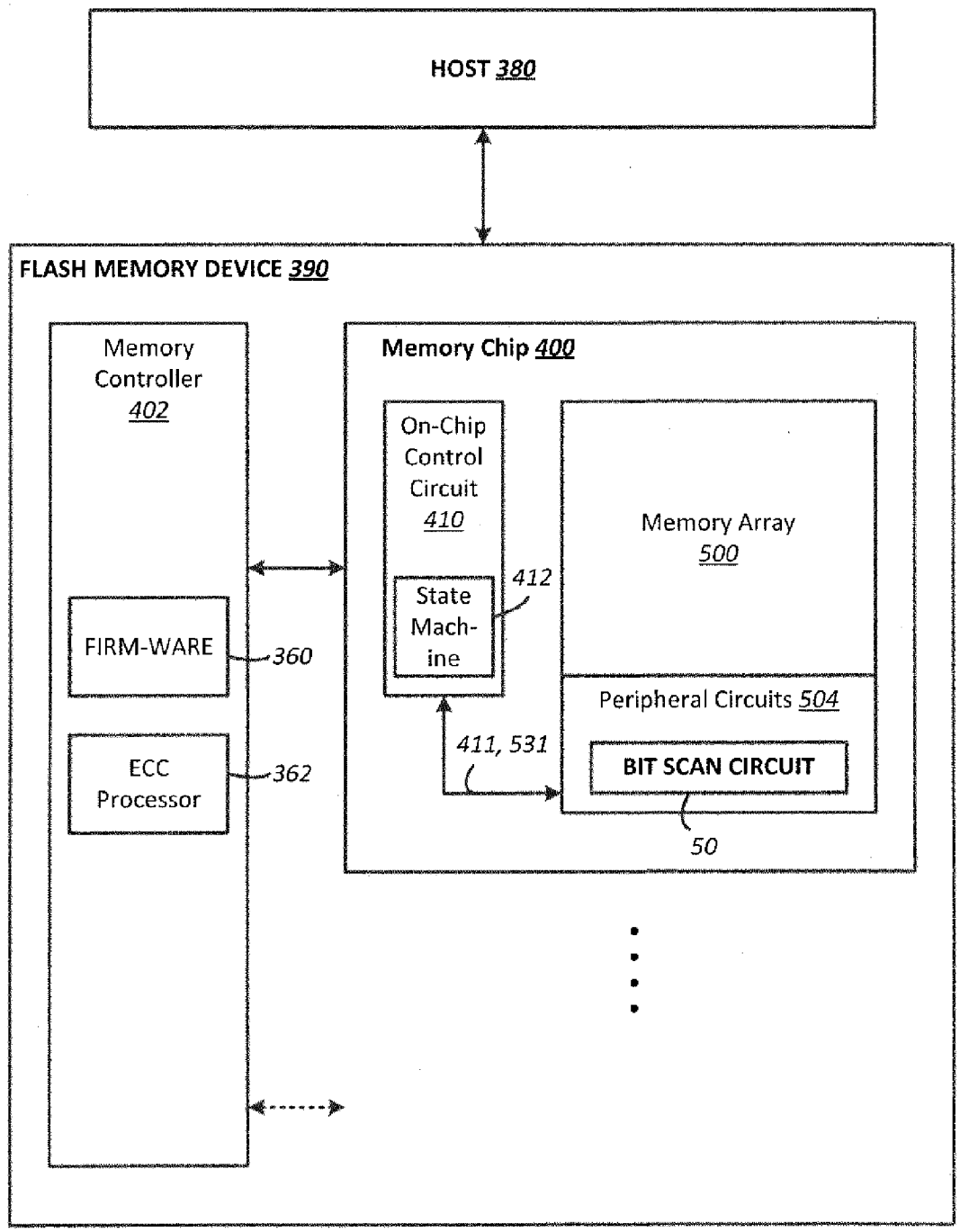
FIG. 1 illustrates a host in communication with a memory device in which the features of the present invention are embodied.

FIG. 1 illustrates an example of a host 380 in communication with a memory device in which the features of the present invention are embodied. The host 380 typically sends data to be stored at the memory device 390 or retrieves data by reading the memory device 390. The memory device 390 includes one or more memory chip 400 managed by a memory controller 402. The memory chip 400 includes a memory array 500 of memory cells with each cell capable of being configured as a multi-level cell ("MLC") for storing multiple bits of data, as well as capable of being configured as a single-level cell ("SLC") for storing 1 bit of data. The memory chip also includes peripheral circuits 504 such as row and column decoders, sense modules, data latches and I/O circuits. An on-chip control circuitry 410 controls low-level memory operations of each chip. The control circuit 410 is an on-chip controller that cooperates with the peripheral circuits to perform memory operations on the memory array 500. The control circuit 410 typically includes a state machine 412 to provide chip level control of memory operations via a data bus 531 and control and address bus 411.

In many implementations, the host 380 communicates and interacts with the memory chip 400 via the memory controller 402. The controller 402 co-operates with the memory chip and controls and manages higher level memory operations. Firmware 360 provides codes to implement the functions of the controller 402. An error correction code ("ECC") processor 362 processes ECC during operations of the memory device.

For example, in a host write, the host 380 sends data to be written to the memory array 500 in logical sectors allocated from a file system of the host's operating system. A memory block management system implemented in the controller stages the sectors and maps and stores them to the physical structure of the memory array. An example of a block management system which may be used is disclosed in United States Patent Application Publication Number: US-2010-0172180-A1, the entire disclosure of which is incorporated herein by reference.

Physical Memory Architecture

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page will be read or programmed together.

Figure 2:
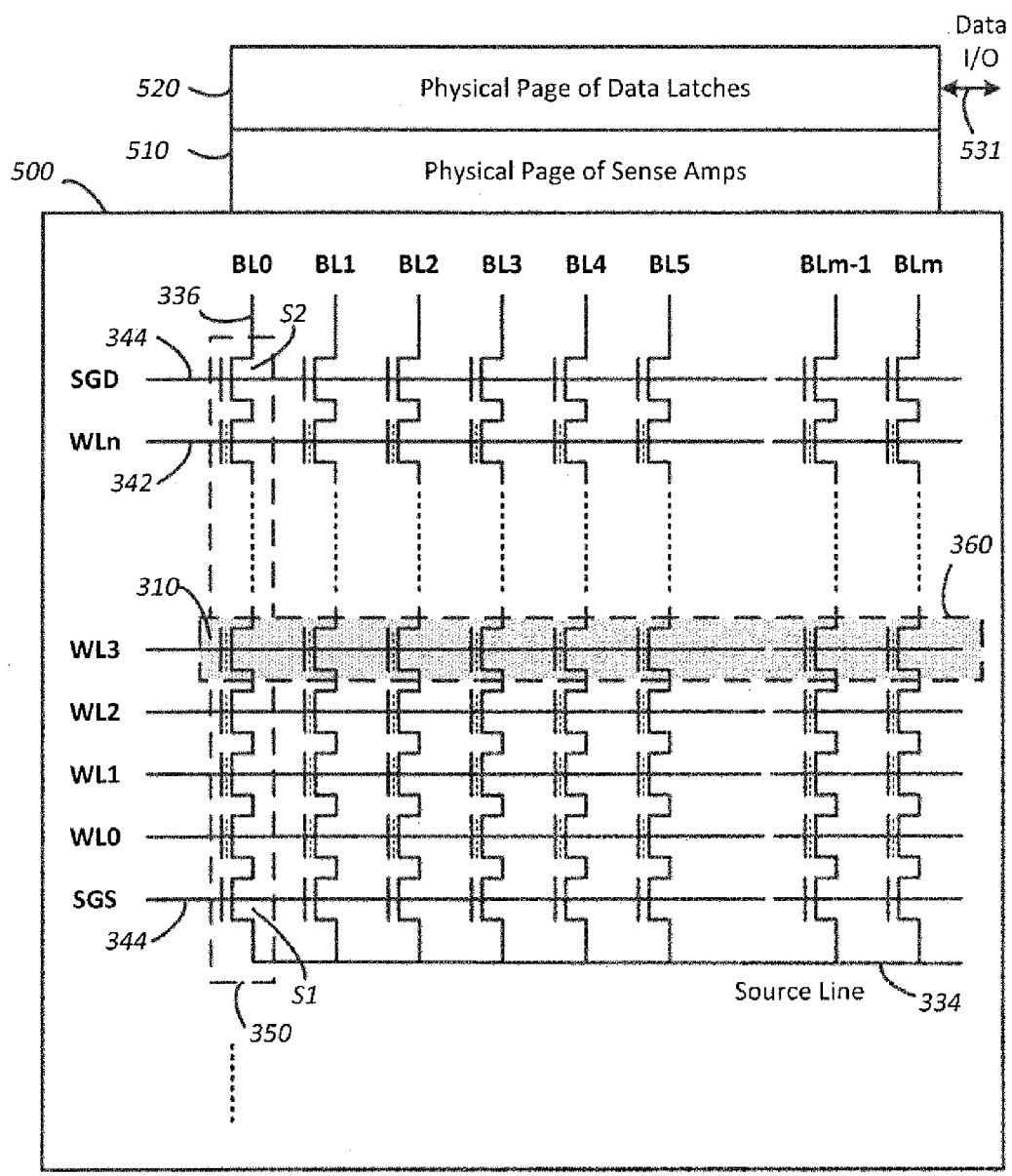
FIG. 2 illustrates a page of memory cells, organized for example in the NAND configuration, being sensed or programmed in parallel.

FIG. 2 illustrates a page of memory cells, organized for example in the NAND configuration, being sensed or programmed in parallel. FIG. 2 essentially shows a bank of NAND strings 350 in the memory array 500 of FIG. 1. A "page" such as the page 360, is a group of memory cells enabled to be sensed or programmed in parallel. This is accomplished in the peripheral circuits by a corresponding page of sense amplifiers 510. The sensed results are latched in a corresponding set of data latches 520. Each sense amplifier can be coupled to a NAND string, such as NAND string 350 via a bit line 336. For example, the page 360 is along a row and is sensed by a sensing voltage applied to the control gates of the cells of the page connected in common to the word line WL3. Along each column, each cell such as cell 10 is accessible by a sense amplifier via a bit line 336. Data in the data latches 520 are toggled in from or out to the memory controller 402 via a data I/O bus 531.

The page referred to above is a physical page memory cells or sense amplifiers. Depending on context, in the case where each cell is storing multi-bit data, each physical page may have multiple data pages.

The NAND string 350 is a series of memory transistors 310 daisy-chained by their sources and drains to form a source terminal and a drain terminal respectively at its two ends. A pair of select transistors S1, S2 controls the memory transistor chain's connection to the external world via the NAND string's source terminal and drain terminal respectively. In a memory array, when the source select transistor S1 is turned on, the source terminal is coupled to a source line 334. Similarly, when the drain select transistor S2 is turned on, the drain terminal of the NAND string is coupled to a bit line 336 of the memory array. Each memory transistor in the chain acts as a memory cell. It has a charge storage element to store a given amount of charge so as to represent an intended memory state. A control gate of each memory transistor allows control over read and write operations. The control gates of corresponding memory transistors of a row of NAND string are all connected to the same word line (such as WL0, WL1, . . . ) Similarly, a control gate of each of the select transistors S1, S2 (accessed via select lines SGS and SGD respectively) provides control access to the NAND string via its source terminal and drain terminal respectively.

Figure 3:
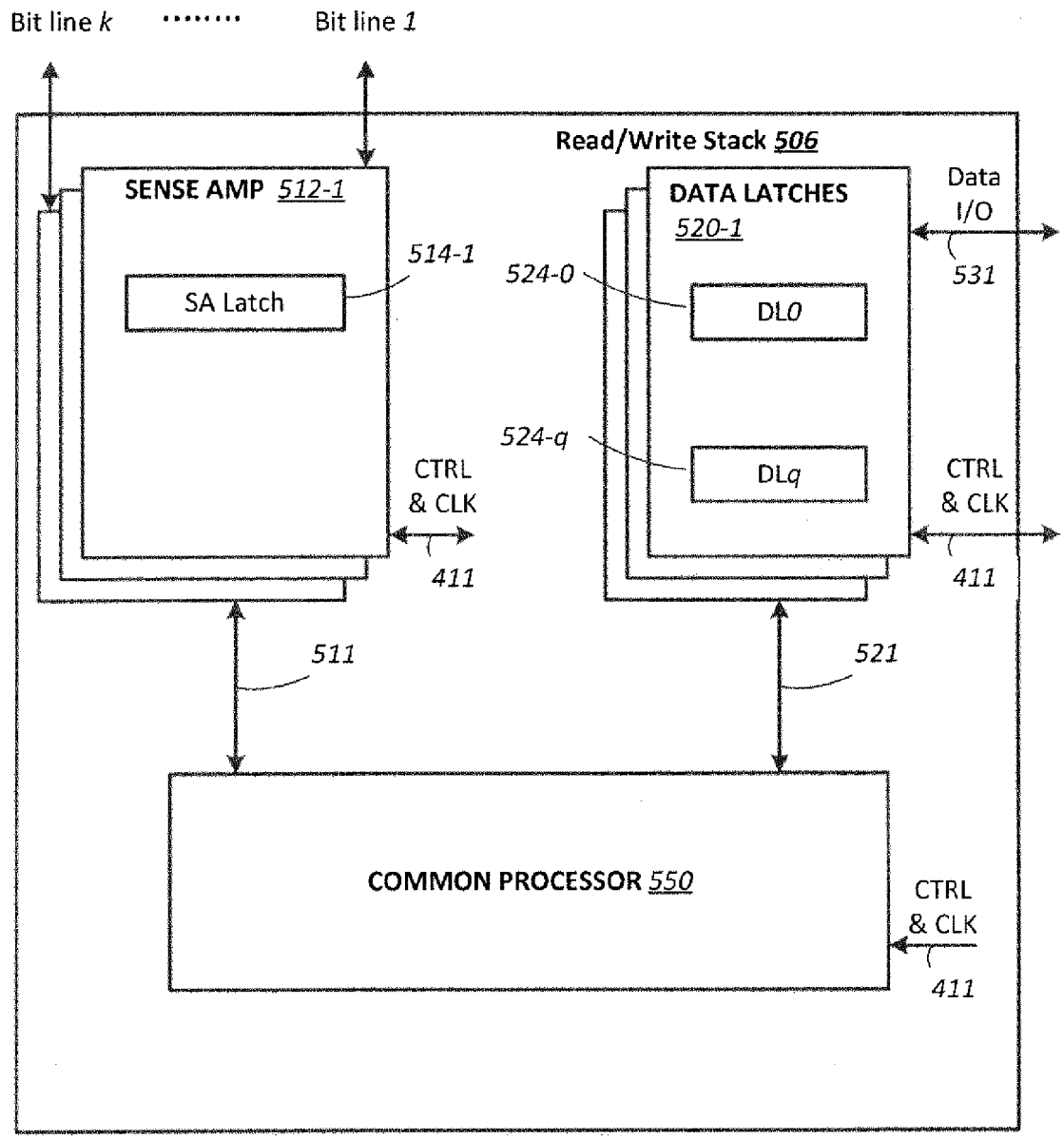
FIG. 3 is a functional block diagram of read/write circuits in the peripheral circuits of FIG. 2.

FIG. 3 is a functional block diagram of read/write circuits in the peripheral circuits of FIG. 2. The read/write circuits 506 include sense amplifiers 512, data latches 520 and a common processor 550. The I/O circuits are coupled to the data latches and not shown explicitly except for a data I/O bus 531. In the embodiment shown, the sense amplifiers and data latches are organized into read/write stacks 506, with each stack serving k memory cells via the bit lines 1 to k, which is a subset of a page in parallel. A plurality of such read/write stacks is provided to service the entire page in parallel. In this way, the number of common processors 550 for the page is reduced. Each stack 506 contains a stack of sense amplifiers 512-1 to 512-$k$ and a stack of data latches 520-1 to 520-$k$. The stack of sense amplifiers and the stack of data latches share the common processor 550 which is able to process data among them. The sense amplifiers 512 communicate with the common processor 550 via a bus 511. The data latches 520 communicate with the common processor 550 via a bus 521. At any one time the common processor 550 processes the data related to a given memory cell. For example, for the memory cell coupled to bit line 1, the corresponding sense amplifier 512-1 latches the data sensed from the memory cell into a sense amplifier latch, SA Latch 514-1. Similarly, the corresponding set of data latches 520-1 stores input or output data associated with the memory cell coupled to bit line 1. In an embodiment, the set of data latches 520-1 comprises a set of data latches, 524-0, . . . , 524-$q$ or respectively DL0, DL1, . . . DLq for storing (q+1)-bits of information. The read/write stack 506 is controlled by the on-chip control circuit via control and address bus 411 and exchange data with the memory controller 402 via the data I/O bus 531.

The page of memory cells shares a common word line and each memory cell of the page is coupled via bit line to a sense amplifier. When the page of memory cells is read or written, it is also referred to as being read from or written to the word line associated with the page of memory cells. Such read/write circuits have been described in U.S. Pat. No. 7,471,575, the entire disclosure of which is incorporated herein by reference.

Programming is typically performed as a series of steps with voltages being applied to memory cells for limited periods as programming pulses. A verification step is normally performed after each programming step. Verification includes reading memory cells to see if they have reached their target levels. Once verification determines that a particular cell has reached its target level, the cell is locked out to prevent further programming. Thus, as a page of memory cells are programmed, more cells are verified as being at their target levels and are locked out from any further programming.

It is common to determine the number of cells that have reached their target levels after each verify step and to continue programming, or terminate programming, based on this determination. Data being programmed may be stored in a first set of latches and data read back from the cells may be stored in a second set of data latches. The binary data pages of the first and second sets of data latches can be compared to verify that the programming was performed correctly. Typically, an XOR operation is performed bit-by-bit between the two sets, and a "1" indicates a disagreement between the two sets. Thus, the result of the comparison is an N-bit string where any occurrence of "1"s would indicate a memory cell that fails to program correctly. Of course, in a reverse logic implementation, "0"s instead of "1"s could indicate an incorrectly programmed memory cell. An operation to determine the number of erroneous bits (number of cells not programmed to their target levels) in this way may be referred to as a bitscan. Examples of bitscan circuits and methods are described in U.S. patent application Ser. No. 13/164,618 by Liu et al. which is incorporated by reference.

If the number of failed bits exceeds a target (e.g. correction capability of a built-in ECC scheme), programming may be repeated. Thus, programming may consist of program, verify, and bitscan steps, that are repeated in multiple cycles until the number of cells at their target levels exceeds some threshold number (i.e. the number of erroneous bits, or error rate, is below a threshold number). The time needed for a bitscan operation may be significant. While a bitscan operation may be performed in parallel with program preparation in some cases, the time needed for bitscan may exceed the time for program preparation so that a bitscan is not entirely hidden (i.e. the bitscan operation adds to the total programming cycle time).

Figure 4:
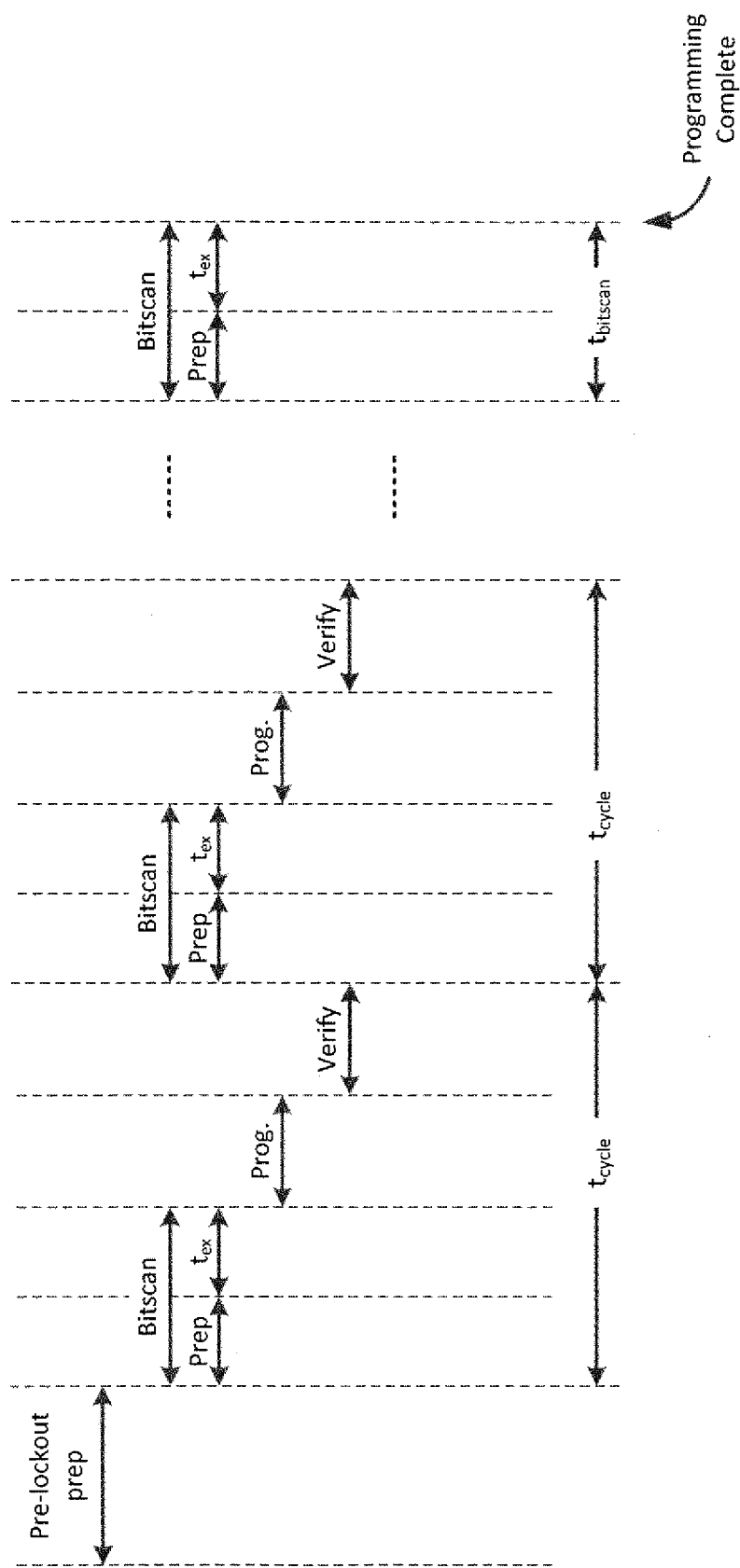
FIG. 4 is a timing diagram for a programming operation.

FIG. 4 shows a timing diagram for a conventional programming operation. Dimensions in FIG. 4 and other timing diagrams are not to scale and are for illustration only. Pre-lockout preparation is performed initially. This typically includes time needed to move the data being programmed to the appropriate internal latches in peripheral circuits of the memory array. Then a bitscan is performed to see if any further programming is needed (even though no programming has occurred, it is possible that the data is such that cells are already in their target states, i.e. the data corresponds to cells in the erased state). The bitscan is performed in parallel with preparation ("Prep") for programming. Such preparation for programming may include pre-charging bit lines that are to be locked out, and applying appropriate voltages to word lines near the word line that is being programmed (boosting). The particular preparation required may depend on the memory design.

In this example the time for a bitscan exceeds the preparation time so that the extra bitscan time ($t_{ex}$) adds to the overall time needed for a program cycle. After the bitscan is completed and it is determined that the cells are not in their target states (i.e. at least some threshold number of cells still require further programming), additional programming is performed ("Prog"). Then a verification step ("Verify") is performed to read data back from the cells. This data is then used for the next bitscan to determine if a further programming step is needed. Thus, in this example, a programming cycle includes a bitscan step (which is performed partially in parallel with program preparation for the subsequent programming step), a programming step, and a verification step. The time for a programming cycle in this example, $t_{cycle}$, depends not only on the time for program preparation, programming, and verification, but also on the extra time for the bitscan operation, i.e. the portion of the bitscan operation that is not performed in parallel with programming preparation, $t_{ex}$. A programming cycle may be considered to start with a bitscan as shown, or alternatively the initial bitscan may be considered as an initialization step that is not part of a cycle, with a cycle beginning with a program step. In any case, a complete cycle includes bitscan, program, and verify steps and takes time $t_{ex}$.

The programming cycle of FIG. 4 is repeated until a bitscan operation indicates that the memory cells are in their target states ("Programming Complete"). FIG. 4 shows two complete cycles but it will be understood that more than two cycles are generally used but are omitted here (as indicated by dotted line). In general, programming completion does not require that all of the cells are in their target states, but instead requires that at least some threshold number of cells are in their target states. Generally, the threshold number that is selected depends on the Error Correction Code (ECC) capacity of the system in question. ECC allows detection and correction of some number of errors. When the number of errors exceeds the maximum, then the data may be uncorrectable, and thus unrecoverable. Even below the limit of a given ECC system, large numbers of errors may make correction very difficult so that ECC consumes significant resources and requires significant time. Thus a threshold number is generally selected that corresponds to an error rate which is correctable by the ECC system within a given time (e.g. before a time-out would occur, or within a time specified by a standard).

The time necessary to perform the programming operation of FIG. 4 (ignoring the pre-lockout preparation time) can be seen to be the cycle time $t_{cycle}$ multiplied by the number of complete cycles, N, and the time for the final bitscan, $t_{bitscan}$ (times for particular steps are denoted by the letter "t" with the name, or abbreviated name, of the step as a subscript). Thus programming time is given by the following equation:

$$\text{Programming time} = N(t_{cycle}) + (t_{bitscan}) \qquad \text{I.}$$

Or, inserting the times that make up the cycle time:

$$\text{Programming time} = N(t_{prog} + t_{verify} + t_{bitscan}) + t_{bitscan} \qquad \text{II.}$$

The bitscan is performed partially in parallel with program preparation so that the extra portion of the bitscan time, $t_{ex}$, is the significant portion. Writing the equation above to separate $t_{ex}$, and to combine preparation and programming times ($t_{prep+prog}$) gives:

$$\text{Programming time} = N(t_{prep+prog} + t_{verify} + t_{ex}) + t_{bitscan} \qquad \text{III.}$$

Figure 5:
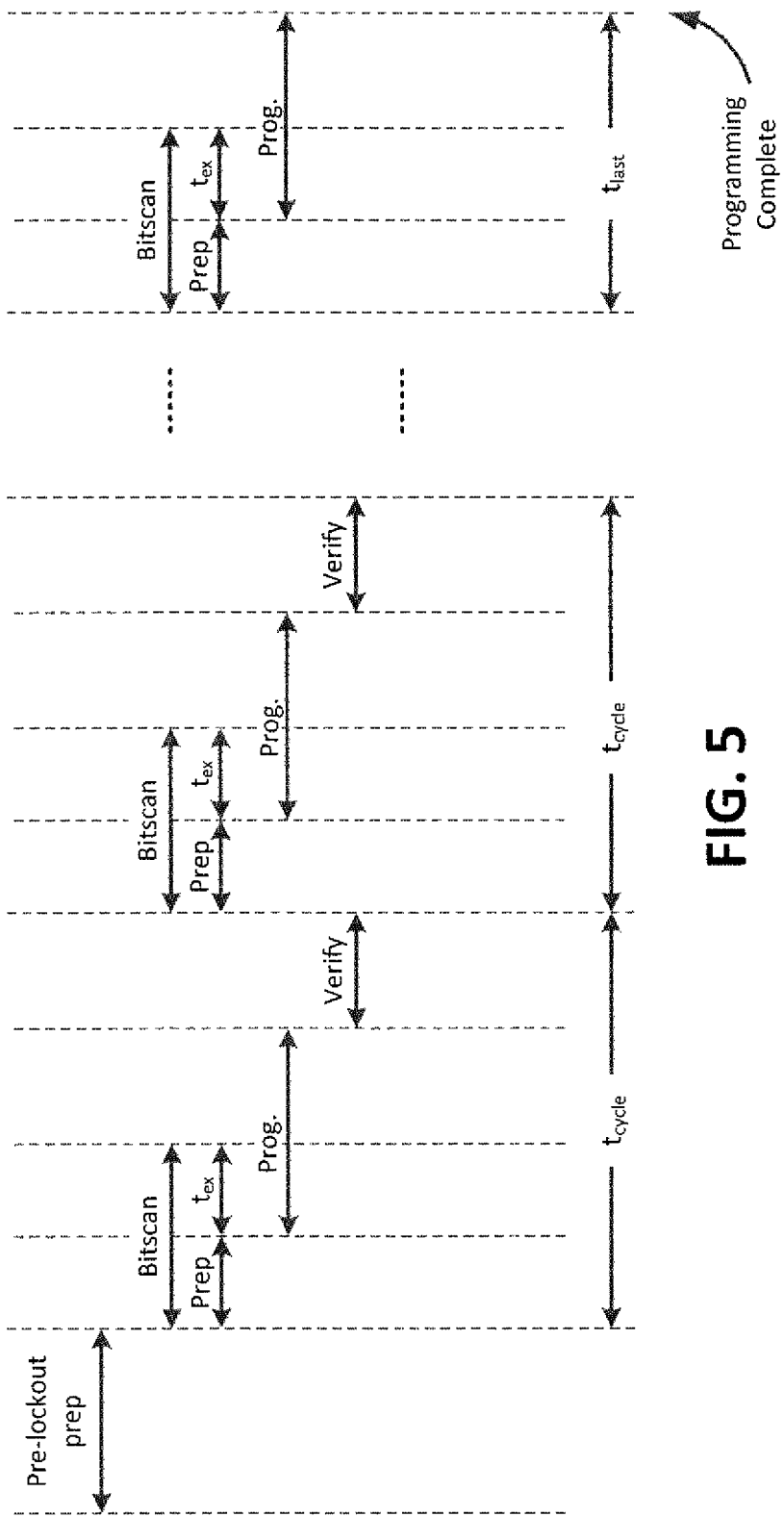
FIG. 5 is a timing diagram for a programming operation with a bitscan performed in parallel with a programming step.

FIG. 5 shows a timing diagram for another programming operation that is different to the programming operation of FIG. 4. In particular, in FIG. 5, bitscan steps are performed partially in parallel with programming steps (and partially in parallel with program preparation as before). Thus, a bitscan operation begins, as in FIG. 4, in parallel with programming preparation. However, unlike the example of FIG. 4, programming starts as soon as programming preparation is complete and does not wait for the results of the bitscan operation. In this way, the bitscan is entirely performed in parallel with other operations and does not add to the time for a programming cycle (i.e. $t_{ex}$ is hidden by the program step). This makes each program cycle shorter by $t_{ex}$.

One aspect of the programming operation of FIG. 5 is that a program step commences before it is known whether the previous programming step completed programming the cells (i.e. the bitscan from the prior program step is not complete, so it is not known if the number of cells in their target states exceeds a threshold value). By the time it is known whether the previous programming step completed programming the cells, after the bitscan is finished, the next programming step is already underway. For example, the bitscan results may be known while a programming pulse is being applied as part of a programming step. Even when the bitscan results indicate that a threshold number of memory cells are in their target states such a program pulse may continue, by maintaining programming voltages to the memory cells, until the pulse is complete. Thus, at least part of a programming pulse occurs after a bitscan determines that the threshold number of cells has been reached.

It has been found that the number of cells reaching their target states follows a reasonably predictable pattern from one programming cycle to the next. (Put another way, the number of failure bits drops in a predictable manner from cycle to cycle.) Thus, when the bitscan shows that the number of cells in their target states is close enough to the threshold number (within some predetermined margin of the threshold number), a final program step may be performed without verification or bitscan steps, on the assumption that the final program step will increase the number of cells in their target states above the threshold number. This final programming step is generally underway when the bitscan indicates that the cells are close enough to being programmed. Thus, a last partial programming cycle is performed that does not include verification. After the final program step is completed programming may be considered to be complete without further verification or any further bitscan. The expectation of complete programming after the final program step is based on expected error rate from knowledge of the behavior of the memory cells from cycle to cycle, and from results of the bitscan of data verified in the previous cycle.

The time necessary to perform the programming operation of FIG. 5 (ignoring the pre-lockout preparation time as before) can be seen to be the cycle time $t_{cycle}$ multiplied by the number of complete cycles, plus the time for the last partial cycle, $t_{last}$. Assuming the total number of programming steps needed is N as before, and counting the last program step as the Nth programming step, means there are N-1 complete cycles and a last partial program cycle. Thus, the program time is given by the following equation:

$$\text{Programming time} = (N-1)t_{cycle} + t_{last} \qquad \text{IV.}$$

The time per cycle in this case is less than before (no extra time, $t_{ex}$, for bitscan) and is simply the time for preparation and programming ($t_{prep+prog}$), plus the time for verifying, $t_{verify}$. And the last partial cycle does not include any verify step, just preparation and programming, resulting in the following equation:

$$\text{Programming time} = (N-1)(t_{prep+prog} + t_{verify}) + t_{prep+prog} \qquad \text{V.}$$

Comparing equation V with equation III shows a significant time saving. There is no bitscan after the final programming step thus saving $t_{bascan}$. The number of complete cycles needed for N programming steps is reduced from N to N-1 because there is a last partial cycle to get to the target states (the last partial cycle is shorter than a full cycle by $t_{verify}$). There is also a time saving in each complete cycle because the bitscan is done in parallel with the program step, thus saving extra time for bitscan, $t_{ex}$, in each complete cycle, a total saving of: $(N-1)t_{ex}$.

It will be understood that different memory systems may behave differently and thus the expected results of the final programming step will depend on the particular memory system. For example, in a given memory fewer than 10 errors per page may be considered correctable by ECC without significant delay and thus data may be considered fully programmed when there are fewer than 10 errors per page. It may be known that when the number of errors per page reaches 20, an additional programming step has a very high probability (near certainty) of reducing the number of errors to fewer than 10. Although 20 errors per page may be uncorrectable, or may only be correctable in an unacceptable manner (e.g. too slow), and such cells would not be considered fully programmed, a bitscan that indicates 20 errors per page may be the last bitscan step in a programming operation. This is because it is known with reasonable certainty that a final programming step will achieve fewer than 10 errors per page, and will thus achieve complete programming. Therefore instead of using a threshold number corresponding to 10 errors per page, a threshold number corresponding to 20 errors per page may be used because an additional 10 errors per page will be eliminated by the final programming step. In general the threshold number used may be different to the target number by up to a predetermined margin that is sufficiently small that a final programming step will achieve the target number.

The particular threshold number for a bitscan to terminate programming may be determined from statistical information that indicates the behavior of cells during a final programming step. In some cases, such a threshold number may be the same for all units across a particular product line and may be recorded in firmware or in some other universal manner. In other cases, the threshold number may be determined on a unit-by-unit basis, e.g. during factory testing or initialization, and may be stored in Read Only Memory (ROM) or in some other manner. In some cases, the threshold number may be modified over the lifetime of a unit. For example, as a memory system is used and changes with wear, it may respond differently to a final programming step and the threshold number may be adjusted accordingly.

Figure 6:
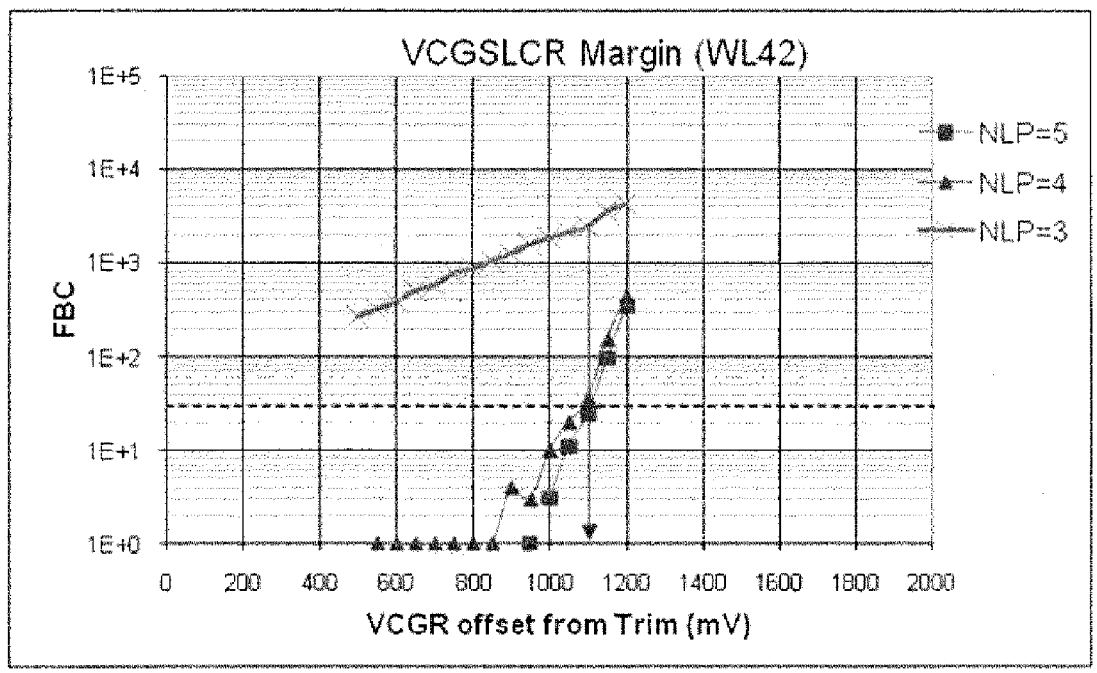
FIG. 6 shows changes in programmed memory cells from programming cycle to programming cycle.

FIG. 6 shows Failure Bit Count (FBC) for different offsets of VCGR (control gate read voltage) for three different numbers of programming cycles (NLP), 3, 4, and 5. It can be seen that after 3 programming cycles there are many failed bits for all values of VCGR. After 4 programming cycles there is a big change in the number of failed bits, with significant numbers of failed bits only beyond an offset of approximately 900 mV. After 5 programming cycles there is a relatively small change in the number of failed bits, with significant numbers of failed bits only beyond an offset of approximately 1000 mV. The data of FIG. 6 indicates that between 4 and 5 cycles there is a relatively small and predictable change in the number of failed bits. Thus, if the number of failed bits is within a predetermined margin of a final target number after 4 programming cycles, it could be predicted with reasonable certainty that the number of failed bits would be lower than the target number after 5 programming cycles.

Figure 7:
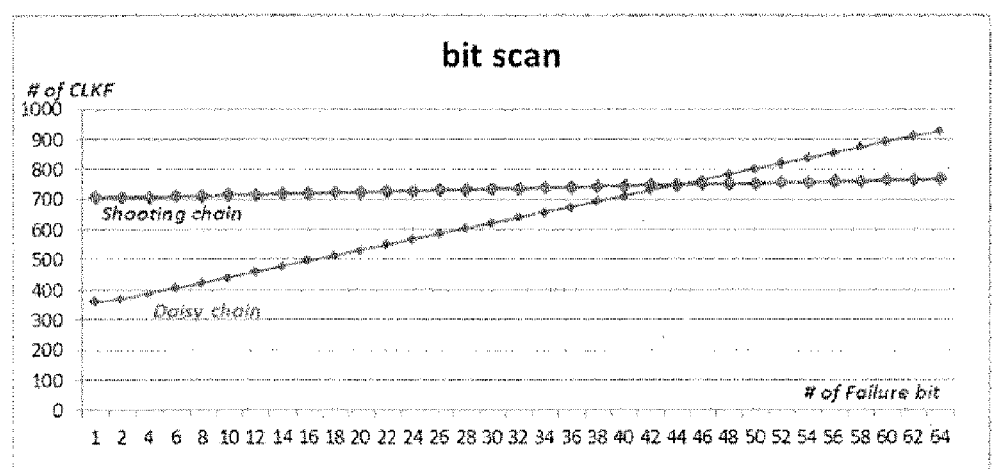
FIG. 7 shows the number of clock cycles needed to perform a bitscan for different bitscan circuits.

FIG. 7 shows the number of clock cycles needed to perform a bitscan operation to determine the number of failed bits using two different circuits, a conventional "daisy chain" circuit, and a "shooting chain" circuit as described in U.S. patent application Ser. No. 13/164,618 (Appendix 1). It can be seen that for higher numbers of failure bits (above approximately 45 in this example) a shooting chain circuit is faster than a daisy chain circuit, while for lower numbers of failure bits the daisy chain circuit is faster. While some memory systems such as described with respect to FIG. 4 require a final bitscan that shows an acceptable, relatively small, number of failed bits, other memory systems such as described with respect to FIG. 5 perform a final programming step that brings the number of failed bits to an acceptable number so that the last bitscan performed may have a relatively large number of failed bits (e.g. may exceed ECC limit). Performing bitscan operations only with relatively large numbers of failed bits means that all bitscan operations are performed under conditions in which shooting chain circuits are faster. Thus, such schemes are particularly suited to shooting chain architecture. However, it will be understood that the present invention is not limited to any particular architecture such as daisy chain or shooting chain and may be applicable to various memory architectures.

Figure 8:
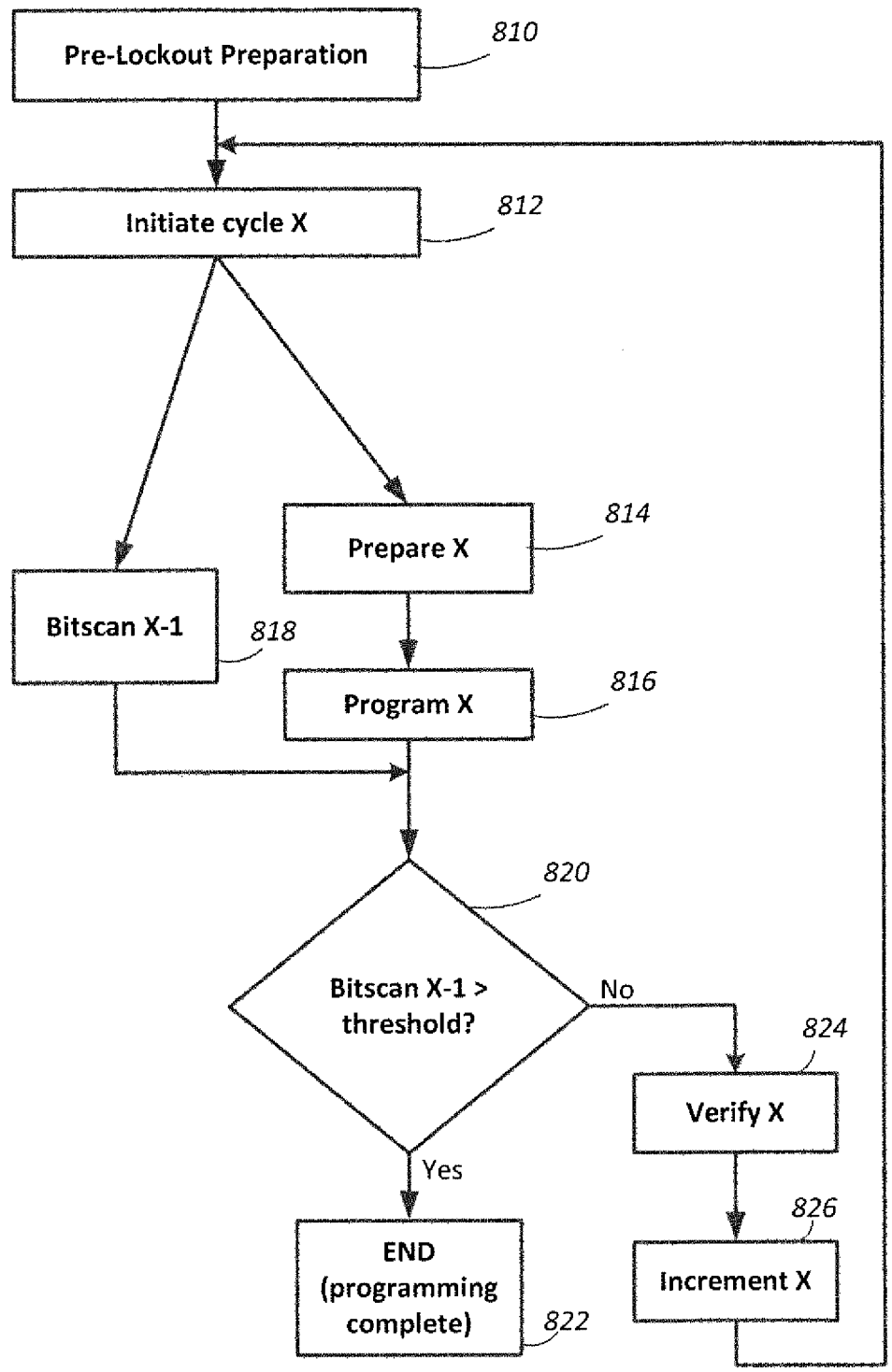
FIG. 8 is a flowchart for a process according to an example.

FIG. 8 is a flowchart showing a programming process according to an example that includes performing bitscan in parallel with programming. Initially, pre-Lockout preparation is performed 810 to load data to the appropriate latches for programming. Then programming cycle X is initiated 812, with the first cycle being cycle 1 for example. Preparation 814 for programming of cycle X may include precharging any bit lines for cells that do not require further programming (i.e. erased state is their target state). Programming of data X, 816, includes applying a programming pulse to move charge into floating gates of cells that are subject to the programming pulse. In parallel to preparation 814 and programming 816, bitscan 818 is performed on previously programmed data X−1. For the first cycle, where there is no previously programmed data, the bitscan may be performed by comparing data to be programmed with empty latches (i.e. latches in a state corresponding to unprogrammed, or erased, memory cells). The results of the bitscan are compared with a threshold number to determine if data X−1 shows more than a threshold number of cells in their target states 820. While FIG. 8 shows this determination being made after program step 816, it may be made in parallel, however no action is taken until program step 816 is complete. If the bitscan 818 shows more than the threshold number of cells are in their target states then the programming process ends 822 and programming is considered complete. If the bitscan 818 shows that fewer than the threshold number of cells are in their target states then the just programmed data X is verified 824. Then the value of X is incremented 826, e.g. from cycle 1 to cycle 2, and the new cycle is initiated 812. The cycle 1 data verified in step 824 is now subject to a bitscan 818 in cycle 2 in parallel with preparing and programming data of cycle 2. These cycles continue until the threshold is met. It can be seen that when bitscan X−1 shows more than the threshold number of cells are in their target states, programming stops only after data X is programmed, i.e. after one more program step which is not followed by verify or bitscan steps.

Conclusion

The foregoing detailed description has been presented for purposes of illustration and description. It is not intended to be exhaustive or to limit the invention to the precise form disclosed. Many modifications and variations are possible in light of the above teaching. For example, both single-level cell (SLC) and multi-level cell (MLC) programming may benefit from techniques described above. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

The invention claimed is:

1. A method of programming data in a plurality of nonvolatile memory cells comprising:
   (a) applying a programming pulse to the plurality of nonvolatile memory cells;
   (b) verifying individually whether the memory cells have reached their respective target levels;
   (c) performing a bitscan operation to identify the number of memory cells that have reached their respective target levels;
   (d) comparing the number of memory cells that have reached their respective target levels with a threshold number;
   (e) repeating steps (a)-(d) until it is determined that the number of memory cells that have reached their respective target levels exceeds the threshold number; and
   (f) subsequent to determining that the number of memory cells that have reached their respective target levels exceeds the threshold number, applying additional programming voltages to the plurality of nonvolatile memory cells.

2. The method of claim 1 wherein the applying additional programming voltages includes applying at least a portion of a final programming pulse.

3. The method of claim 2 wherein the final programming pulse is initiated prior to determining that the number of memory cells that have reached their respective target levels exceeds the threshold number.

4. The method of claim 3 wherein the final programming pulse increases the number of memory cells that have reached their respective target levels by a predictable number, the predictable number obtained from prior observation of memory cells subject to programming.

5. The method of claim 4 wherein the threshold number corresponds to an error rate that exceeds Error Correction Code (ECC) correction capacity, and wherein the application of the additional programming pulse increases the number of memory cells that have reached their respective target levels to a number corresponding to an error rate that is within ECC correction capacity.

6. The method of claim 1 wherein steps (c) and (d) of a first cycle are performed in parallel with step (a) of a second cycle.

7. The method of claim 1 wherein the additional programming voltages are applied without subsequently verifying whether the memory cells have reached their respective target levels, and without subsequently performing a bitscan operation to determine the number of memory cells that have reached their respective target levels.

8. A method of programming data in a plurality of nonvolatile memory cells in multiple programming cycles, comprising:
   performing a plurality of programming cycles, each of the plurality of cycles including:
   (a) applying a programming pulse to the plurality of nonvolatile memory cells;
   (b) subsequently verifying individually whether the memory cells have reached their respective target levels;
   (c) subsequently performing a bitscan operation to identify the number of memory cells that have reached their respective target levels, the bitscan operation performed at least partially in parallel with step (a) of a subsequent programming cycle; and
   (d) subsequently comparing the number of memory cells that have reached their respective target levels with a threshold number.

9. The method of claim 5 further comprising: in response to determining that the number of memory cells that have reached their respective target levels exceeds the threshold number, terminating the subsequent programming cycle after step (a) without performing steps (b)-(d).

10. The method of claim 8 wherein the threshold number corresponds to uncorrectable data and the terminated programming cycle brings the number of memory cells that have reached their respective target levels to a final number that corresponds to correctable data.

11. The method of claim 9 wherein the effect of the terminated programming cycle is known from observed cycle-to-cycle changes in numbers of memory cells reaching their respective target levels.

12. The method of claim 10 wherein the threshold number corresponds to data that is uncorrectable by an ECC scheme used to encode data prior to storage and the correctable data is correctable by the ECC scheme.

13. A flash memory system, comprising:
   an array of flash memory cells;
   read/write circuits that program cells of the array of flash memory cells by performing a plurality of programming cycles, each of the plurality of programming cycles including:
   (a) applying a programming pulse to the plurality of nonvolatile memory cells;

(b) subsequently verifying individually whether the memory cells have reached their respective target levels;

(c) subsequently performing a bitscan operation to identify the number of memory cells that have reached their respective target levels, the bitscan operation performed at least partially in parallel with step (a) of a subsequent programming cycle; and (d) subsequently comparing the number of memory cells that have reached their respective target levels with a threshold number.

14. The flash memory system of claim 13 wherein the read/write circuits terminate the subsequent programming cycle after step (a) without performing steps (b)-(d) in response to determining that the number of memory cells that have reached their respective target levels exceeds the threshold number.

15. The flash memory system of claim 14 further comprising Error Correction Coding (ECC) circuits.

16. The flash memory system of claim 15 wherein the threshold number corresponds to data that is uncorrectable by the ECC circuits, and wherein the terminated programming cycle brings the number of memory cells that have reached their respective target levels to a number that corresponds to data that is correctable by the ECC circuits.

17. The flash memory system of claim 13 wherein the array of flash memory cells is arranged with cells connected in NAND strings to form a NAND flash memory array.

18. The flash memory system of claim 13 wherein the array of flash memory cells comprises Single Level Cell (SLC) cells that are limited to two programmed states.

19. The flash memory system of claim 13 wherein the array of flash memory cells comprises Multi Level Cell (MLC) cells that have more than two programmed states.

20. The flash memory system of claim 13 further comprising Error Correction Coding (ECC) circuits.

* * * * *